(12) United States Patent
Lee (10) Patent No.: US 9,488,675 B2
(45) Date of Patent: Nov. 8, 2016

(54) TEST SOCKET HAVING HIGH-DENSITY CONDUCTIVE UNIT, AND METHOD FOR MANUFACTURING SAME

(71) Applicant: ISC CO., LTD., Seongnam-si, Gyeonggi-do (KR)

(72) Inventor: Jae Hak Lee, Seongnam-si (KR)

(73) Assignee: ISC CO., LTD., Seongnam-si, Gyeonggi-do (KR)

( * ) Notice: Subject to any disclaimer, the term of this patent is extended or adjusted under 35 U.S.C. 154(b) by 0 days.

(21) Appl. No.: 14/355,090

(22) PCT Filed: Apr. 3, 2013

(86) PCT No.: PCT/KR2013/002748
§ 371 (c)(1),
(2) Date: Apr. 29, 2014

(87) PCT Pub. No.: WO2013/151316
PCT Pub. Date: Oct. 10, 2013

(65) Prior Publication Data
US 2015/0293147 A1    Oct. 15, 2015

(30) Foreign Application Priority Data

Apr. 3, 2012    (KR) .......................... 10-2011-0034578

(51) Int. Cl.
*G01R 1/04*        (2006.01)
*G01R 1/073*       (2006.01)
(Continued)

(52) U.S. Cl.
CPC ........... *G01R 1/0441* (2013.01); *G01R 1/0466* (2013.01); *G01R 1/0483* (2013.01);
(Continued)

(58) Field of Classification Search
CPC .. G01R 1/0441; G01R 1/07314; G01R 3/00; H01R 43/002
USPC ..................................................... 324/756.02
See application file for complete search history.

(56) References Cited

U.S. PATENT DOCUMENTS 6,524,115 B1    2/2003  Gates et al.
6,574,114 B1 *  6/2003  Brindle .............. G02B 6/12007
                                                         174/262

(Continued)

FOREIGN PATENT DOCUMENTS

CN    1349101 A    5/2002
CN    1473378 A    2/2004
(Continued)

OTHER PUBLICATIONS

WO2010082715A1.*
(Continued)

*Primary Examiner* — Jermele M Hollington
*Assistant Examiner* — Zannatul Ferdous
(74) *Attorney, Agent, or Firm* — Harness, Dickey & Pierce, P.L.C.

(57) ABSTRACT

The present invention relates to a test socket having a high-density conductive unit, and to a method for manufacturing same, whereby an elastic conductive sheet is arranged at a position corresponding to the terminal of the device, and includes a first conductive unit arranged in the thickness direction of an elastic material and an insulating support unit for supporting the first conductive unit. A support sheet is attached to the elastic conductive sheet and has through-holes corresponding to the terminal of the device. A second conductive unit is arranged in the through-holes of the support sheet in the thickness direction in an elastic material.

10 Claims, 6 Drawing Sheets

(51) Int. Cl.
*G01R 3/00* (2006.01)
*H01R 43/00* (2006.01)
*H01R 12/71* (2011.01)
*H01R 13/24* (2006.01)
*H01R 12/73* (2011.01)

(52) U.S. Cl.
CPC ............ *G01R1/07314* (2013.01); *G01R 3/00* (2013.01); *H01R 12/714* (2013.01); *H01R 13/2414* (2013.01); *H01R 43/002* (2013.01); *H01R 12/73* (2013.01)

(56) References Cited

U.S. PATENT DOCUMENTS

| | | | |
|---|---|---|---|
| 7,190,180 B2 | 3/2007 | Yamada et al. | |
| 7,384,279 B2* | 6/2008 | Igarashi | G01R 1/0735 439/66 |
| 2001/0016435 A1 | 8/2001 | Fujimura | |
| 2002/0060583 A1* | 5/2002 | Kimura | H01R 13/2414 324/755.09 |
| 2004/0012383 A1 | 1/2004 | Kimura | |
| 2006/0084297 A1 | 4/2006 | Inoue et al. | |
| 2006/0121757 A1* | 6/2006 | Chung | G01R 1/0483 439/91 |
| 2008/0048686 A1 | 2/2008 | Sato et al. | |
| 2011/0001505 A1* | 1/2011 | Nam | G01R 1/0483 324/756.02 |
| 2011/0102009 A1 | 5/2011 | Lee | |

FOREIGN PATENT DOCUMENTS

| | | | | |
|---|---|---|---|---|
| CN | 1639919 A | 7/2005 | | |
| CN | 1685568 A | 10/2005 | | |
| CN | 1701468 A | 11/2005 | | |
| CN | 1808125 A | 7/2006 | | |
| CN | 1957260 A | 5/2007 | | |
| JP | 2000-156119 A | 6/2000 | | |
| JP | 2001-093945 A | 4/2001 | | |
| JP | 2006-162617 A | 6/2006 | | |
| JP | 2010-212616 A | 9/2010 | | |
| JP | 2011-192737 A | 9/2011 | | |
| KR | 2007-0047496 A | 5/2007 | | |
| KR | 10-0926777 B1 | 11/2009 | | |
| KR | 2009-0116136 A | 11/2009 | | |
| KR | 2010-0005535 A | 1/2010 | | |
| KR | 2010-0045705 A | 5/2010 | | |
| KR | 20100084316 | * | 7/2010 | ............ G01R 31/26 |
| KR | 101019720 B1 | 3/2011 | | |
| KR | 2011-0085788 A | 7/2011 | | |
| WO | 2009128619 A1 | 10/2009 | | |
| WO | 2010082715 A1 | 7/2010 | | |

OTHER PUBLICATIONS

International Search Report (in Korean with English translation) for PCT/KR2013/002748, mailed Jul. 2, 2013; ISA/KR.
Japanese Office Action-Notice of Rejection, issued by the Japanese Patent Office on Apr. 21, 2015, which corresponds to the Japanese Patent Application No. 2014-538736, which corresponds to the instant application. (No translation provided.).
Preliminary Notice of First Office Action dated Jul. 28, 2014 for Taiwan Patent Application No. 102112178, Taiwanese & English Translation.
Office Action for Korean Patent Application No. 2014-538736 issued Nov. 4, 2015 with English translation.
Office Action for corresponding Chinese Patent Application No. 201380003857.2 dated Oct. 28, 2015 with English Translation.

* cited by examiner

TEST SOCKET HAVING HIGH-DENSITY CONDUCTIVE UNIT, AND METHOD FOR MANUFACTURING SAME

CROSS-REFERENCE TO RELATED APPLICATIONS

This application is a 371 U.S. National Stage of International Application No. PCT/KR2013/002748, filed Apr. 3, 2013, which claims priority to Korean Patent Application No. 10-2012-0034578, filed on Apr. 3, 2012, the disclosures of which are herein incorporated by reference in their entirety.

TECHNICAL FIELD

The present invention relates to a test socket having a high-density conductive unit, and a manufacturing method thereof, and more particularly, to a test socket having a high-density conductive unit that may enhance electrical contact performance with respect to a terminal of a device to be tested and may have excellent durability, and a method of manufacturing the same.

BACKGROUND ART

In general, in order to test electrical properties of a device to be tested, stable electrical coupling between the device to be tested and a test device should be established. Typically, a test socket is used as a coupling unit between the device to be tested and the test device.

Such a test socket couples a terminal of the device to be tested to a pad of the test device and enables electrical signals to flow in both directions. To this end, an elastic conductive sheet or a spring pin is used as a contact unit that is used in the test socket. Such an elastic conductive sheet connects an elastic conductive unit to the terminal of the device to be tested, and since the spring pin has a spring therein, it ensures smooth coupling between the device to be tested and the test device, it may mitigate a mechanical shock that may occur when coupling is performed, and thus it has been used for most test sockets.

Figure 1:
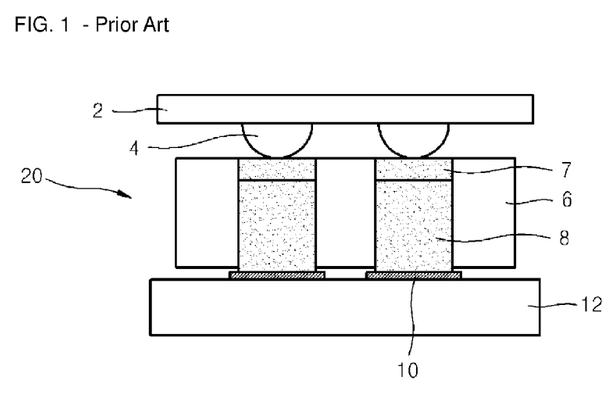
FIGS. 1 to 3 are views of typical test sockets.

As an example of the test socket, a test socket 20 shown in FIG. 1 includes a conductive silicon unit 8 that is in contact with a terminal 4 of a ball grid array (BGA) semiconductor device 2, and a dielectric silicon unit 6 that is not in contact with the terminal 4 of the semiconductor device 2 to be able to support the conductive silicon unit 8 and functions as a dielectric layer. A ring-type conductive ring 7 is disposed on the upper surface of the conductive silicon unit 8 that electrically couples a contact pad of a socket board 12, which performs a test on the semiconductor device 2, to the terminal 4 of the semiconductor device 2

The test socket is efficient in a test system that presses several semiconductor devices to establish electrical contact, each of its conductive silicon units is independently pressed, it is easy to match with the flatness of a peripheral apparatus, and thus it is possible to enhance its electrical properties. In addition, since the test socket prevents the conductive silicon unit of a metal ring from becoming spread when being pressed by the lead terminal of the semiconductor and minimizes displacement, it has a characteristic in that life of a contactor is extended.

Figure 2:
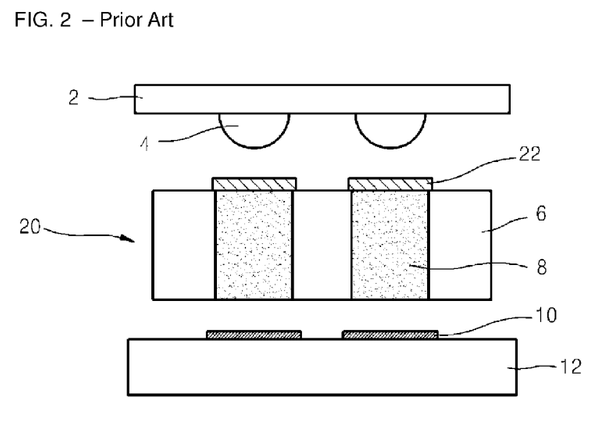

A test socket of FIG. 2 disclosed as another typical example includes, by a plating, etching, or coating technique, a conductor 22 on the upper and lower surfaces of the conductive silicon unit 8 that electrically couples the contact pad 10 of the socket board 12 performing a test on the semiconductor device 2 to the terminal 4 of the semiconductor device 2.

According to the typical test socket described above, since the rigid conductor 22 is disposed on the upper and lower surfaces of the completed conductive silicon unit by the plating, etching, or coating technique, the elasticity of a contact unit decreases as compared to the silicon unit without the conductor. Thus, advantages of an integrated silicon contactor that is intended to be in elastic contact with the terminal of the semiconductor device and a pad of a test board decrease, and due to frequent contacts, it has limitations in that a plated, etched, or coated surface, and the terminal of a counterpart semiconductor device or the pad of the test board are damaged and a foreign material may enter.

Figure 3:
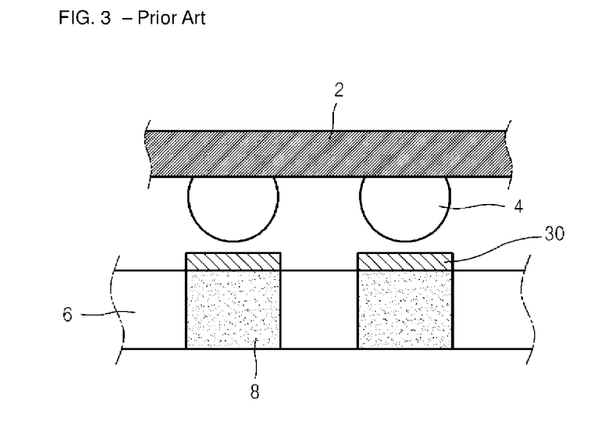

In order to solve these limitations, a test socket as shown in FIG. 3 is disclosed. Such a test socket includes a conductive silicon unit 8 that is in contact with the terminal 4 of the BGA semiconductor device 2 and that is formed by mixing silicon with conductive metallic powder; and a dielectric silicon unit 6 that is not in contact with the terminal 4 of the semiconductor device 2 to be able to support the conductive silicon unit 8 and functions as a dielectric layer. In this case, one or both of an upper part or a lower part of the conductive silicon unit 8 has conductive reinforced layers 30 with higher density than that of the conductive powder of the conductive silicon unit 8. Such a test socket as shown in FIG. 3 has an effect of enhancing conductivity.

However, such a typical technology has the following limitations.

While conductivity is enhanced by the conductive reinforced layer, the conductive reinforced layer may be easily deformed or damaged in frequent contact processes with the terminal of the semiconductor device 2 since it protrudes from the upper part of the conductive silicon unit. In particular, due to frequent contacts with the terminal, the protruding conductive reinforced layer may be damaged and may not maintain its appropriate shape.

DETAILED DESCRIPTION OF THE INVENTION

Technical Problem

The present invention provides a test socket having a high-density conductive unit that improves electrical contact and enhances durability, and a method of manufacturing the same.

Technical Solution

According to an aspect of the present invention, there is provided a test socket arranged between a device to be tested and test device and electrically coupling a terminal of the device to be tested to a pad of the test device, the test socket including an elastic conductive sheet including a first conductive unit that is arranged to face the terminal of the device to be tested, wherein a plurality of first conductive particles are arranged in an elastic material in a thickness direction, and a dielectric support unit that supports the first conductive UNIT, AND insulates the first conductive unit from a neighboring first conductive unit; a support sheet attached to at least one of a top and a bottom of the elastic conductive sheet, wherein the support sheet has a through hole facing the terminal of the device to be tested; and a second conductive unit arranged in the through hole of the support sheet, wherein a plurality of second conductive particles are arranged in an elastic material in a thickness direction, and wherein the second conductive particle is arranged in the elastic material at a higher density than the first conductive particle.

A median droplet diameter of the second conductive particle may be smaller than that of the first conductive particle.

The median droplet diameter of the second conductive particle may be two times to 10 times smaller than that of the first conductive particle.

The second conductive unit may be integrally attached into the through hole.

The second conductive unit may be integrally attached into the first conductive unit.

The support sheet may have higher strength than the dielectric support unit.

A separating section may be formed in the support sheet to allow neighboring second conductive units to independently operate.

The separating section may be a cutting groove or a cutting hole that is formed by cutting the support sheet.

According to another aspect of the present invention, there is provided a method of manufacturing a test socket that is arranged between a device to be tested and test device and electrically coupling a terminal of the device to be tested to a pad of the test device, the method including forming a plurality of through holes on a sheet-type support sheet to face terminals of the device to be tested; providing a mold having a cavity and arranging the sheet-type support sheet in the cavity; charging in the through hole a liquid elastic material in which a plurality of second conductive particles is distributed; charging in the cavity a liquid elastic material in which first conductive particles are distributed; and arranging the first conductive particles in a row to face the terminals of the device to be tested by applying a magnetic field, and wherein a number of the second conductive particles distributed in the liquid elastic material is determined to allow the second conductive particles to be arranged at a higher density than the first conductive particles that are arranged in a row.

A median droplet diameter of the second conductive particle may be smaller than that of the first conductive particle.

A median droplet diameter of the second conductive particle may be equivalent to that of the first conductive particle.

According to another aspect of the present invention, there is provided a method of manufacturing a test socket that is arranged between a device to be tested and a test device and electrically coupling a terminal of the device to be tested to a pad of the test device, the method including forming a plurality of through holes on a sheet-type support sheet to face terminals of the device to be tested; charging in the through hole a liquid elastic material in which a plurality of second conductive particles is distributed, and curing the liquid elastic material; charging in a mold a liquid elastic material in which a plurality of first conductive particles are distributed, arranging the first conductive particles in a row by applying a magnetic field to parts corresponding to the terminals of the device to be tested, and curing the liquid elastic material to manufacture an elastic conductive sheet; and attaching the support sheet to at least one of a top and a bottom of the elastic conductive sheet.

The elastic conductive sheet and the support sheet may be adhered to each other by an adhesive material.

Advantageous Effects

A test socket according to embodiments of the present invention includes a second conductive unit that is arranged in a support sheet, in which a plurality of second conductive particles are integrated at high-density. Thus, electrical conductivity and durability may be enhanced.

DESCRIPTION OF THE DRAWINGS

The above and other features and advantages of the present invention will become more apparent by describing in detail exemplary embodiments thereof with reference to the attached drawings in which.

BEST MODE

Test sockets according to embodiments of the present invention will be described below in detail with reference to the accompanying drawings.

Figure 4:
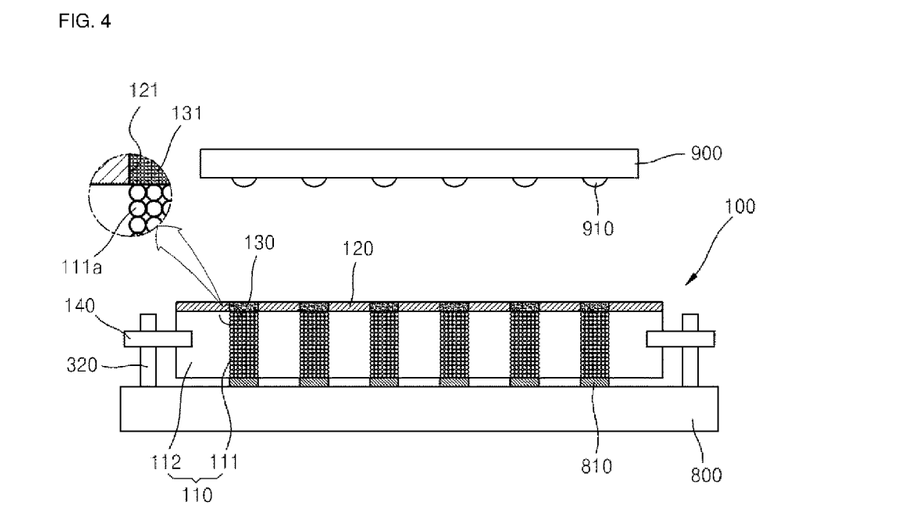
FIG. 4 is a view of a test socket according to an embodiment of the present invention.
Figure 5:
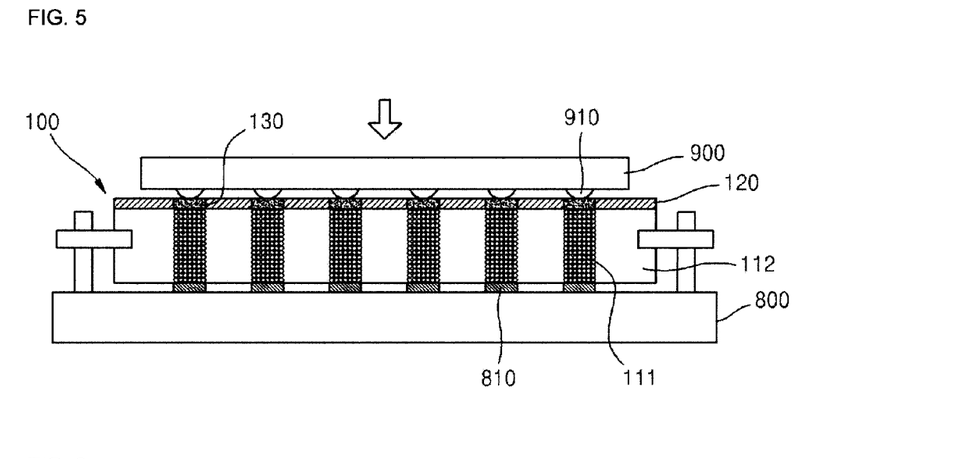
FIG. 5 is an operational view of FIG. 4.

FIG. 4 is a view of a test socket 100 according to an embodiment of the present invention, and FIG. 5 is an operational view of FIG. 4. The test socket 100 according to the present embodiment is arranged between a device to be tested 900 and a test device 800 and electrically couples terminals 910 of the device to be tested 900 to pads 810 of the test device 800.

Such a test socket 100 includes an elastic conductive sheet 110, a support sheet 120, and a second conductive unit 130.

The elastic conductive sheet 110 enables an electrical flow in a thickness direction and disables an electrical flow in a surface direction perpendicular to the thickness direction. The elastic conductive sheet 110 is designed to be able to absorb a shock that is applied from the terminal 910 of the device to be tested 900, while being elastically compressed. Such an elastic conductive sheet 110 includes first conductive units 111 and a dielectric support unit 112.

The first conductive units 111 are arranged to face the terminals 910 of the device to be tested 900 and a plurality of first conductive particles 111a are arranged in an elastic material in a row in a thickness direction.

A heat-resistant polymeric material with a bridge structure may be used as the elastic material that forms the first conductive units 111. Various materials may be used as a thermosetting polymeric material forming element that may be used to obtain such a bridge-structure polymeric material, and in the present embodiment, liquid silicon rubber is selected. The liquid silicon rubber may be an adding type or a condensation type, and in the present embodiment, adding-type liquid silicon rubber is selected. In a case where the first conductive units 111 are formed of vulcanized material of the liquid silicon rubber (hereinafter, referred to as "silicon-rubber vulcanized material"), the silicon vulcanized material may be less than or equal to 10%, 8%, or 6% in a compression set at 150° C. If the compression set exceeds 10%, a chain of conductive particles at the conductive unit 111 becomes disordered when the resulting anisotropically conductive connector is used repeatedly over many times or used repeatedly under a high-temperature environment. As a result, it becomes difficult to maintain desired conductivity. A material which is coated with a high-conductivity metal on the surface of a core particle exhibiting magnetism may be used as the first conductive particles 111*a*. In this case, the high-conductivity metal indicates metal that has a conductance higher than $5 \times 10^6$ $\Omega$/m at 0° C. A magnetic core particle for obtaining a conductive particle P may have a number-average particle diameter of 3 μm to 40 μm. In this case, the number-average particle diameter of the magnetic core particle indicates a value measured by a laser diffraction technique. Although steel, nickel, cobalt, or material that is obtained by being coated with copper or resin may be used as the magnetic core particle, material that has saturation magnetization equal to or greater than 0.1 Wb/m$^2$, 0.3 Wb/m$^2$, or 0.5 Wb/m$^2$ may be selected, and steel, nickel, cobalt or an alloy thereof may be, in particular, selected.

Gold, silver, rhodium, platinum, chrome, etc. may be used as the high-conductivity metal that is coated on the surface of the magnetic core particle, and among these, gold may be selected since it is chemically stable and has a high conductance.

The dielectric support unit 112 plays a role of maintaining a dielectric property between the conductive units while supporting the conductive units. Such a dielectric support unit 112 may use the same material as the elastic material of the first conductive units 111 but the present invention is not limited thereto and any materials that have good elasticity and an excellent dielectric property may be used.

The support sheet 120 may be attached to the top of the elastic conductive sheet 110. Through holes 121 may be formed in the support sheet 120 to face the terminals 910 of the device to be tested 900. The support sheet 120 performs a function of supporting second conductive units 130 to be described below and a material with higher strength than a elastic material of the second conductive unit 130 may be used for the support sheet 120. For example, a synthetic resin material such as polyimide may be used. However, the present invention is not limited thereto and silicon, urethane, or other elastic materials may be used.

The through holes 121 of the support sheet 120 may be formed by using a laser or may be formed by another form of mechanical machining.

The second conductive unit 130 is arranged in the through hole 121 of the support sheet 120 and a plurality of second conductive particles 131 are arranged in an elastic material in a thickness direction. The elastic material forming such a second conductive unit 130 may be the same or similar to the elastic material of the first conductive unit 111. In addition, a material having a higher strength than that of the first conductive unit 111 may be used as needed. The amount of the elastic material arranged in the second conductive unit 130 per unit area may be less than that of the elastic material arranged in the first conductive unit 111.

The material of the second conductive particle 131 may be the same or similar to that of the first conductive particle 111*a*. However, the second conductive particle 131 may be arranged in the elastic material at a higher density than the first conductive particle 111*a*. For example, a part occupied by the second conductive particle 131 per unit area may be larger than that occupied by the first conductive particle 111*a*. Thus, the second conductive particles 131 may be densely arranged.

The mean droplet diameter of such a second conductive particle 131 may be smaller than that of the first conductive particle 111*a*. For example, the second conductive particles 131 with a smaller particle diameter than the first conductive particle 111*a* may be densely arranged in the elastic material. In this case, the mean droplet diameter of the second conductive particle 131 may be two times to ten times smaller than that of the first conductive particle 111*a*.

The second conductive unit 130 may be integrally attached to the first through hole 121 of the support sheet 120 and to the first conductive unit 111. Since the second conductive unit 130 is integrally attached to the support sheet 120 and the first conductive unit 111, it is not easily separated or damaged even if in frequent contact with the terminal 910 of the device to be tested 900.

Reference numerals 140 and 320 refer to a metal frame and a guide pin, respectively. The metal frame 140 forms the perimeter of the elastic rubber sheet 110 and the guide pin 320 protrudes upward from the device to be tested 800 to align a test socket with a test device.

A test socket 100 according to an embodiment of the present invention may be manufactured as follows.

Figure 6:
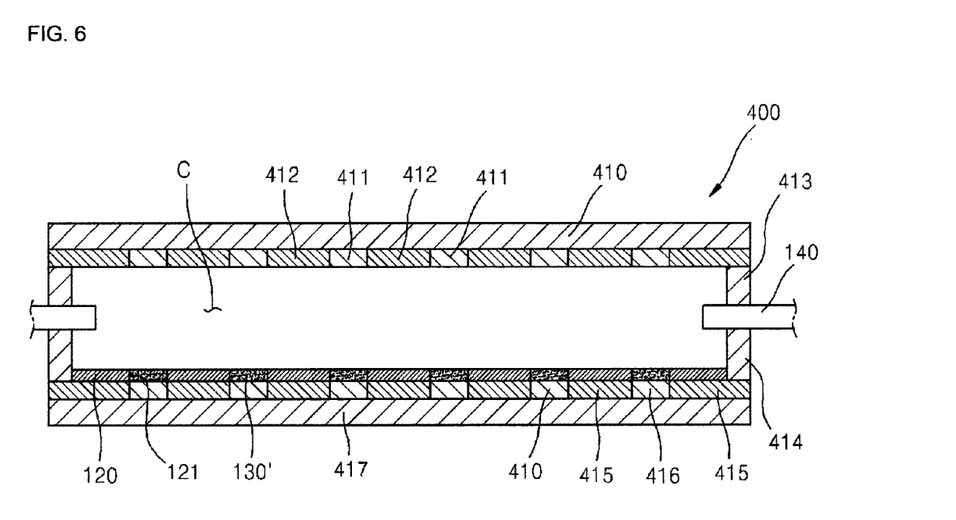
FIGS. 6 to 8 are views of embodiments of manufacturing the test socket of FIG. 4.
Figure 7:
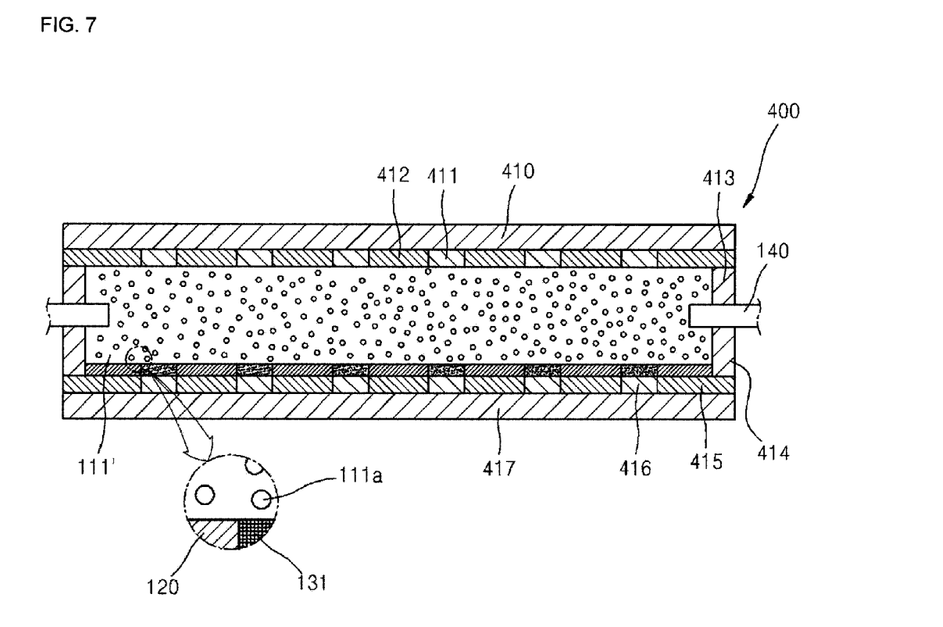
Figure 8:
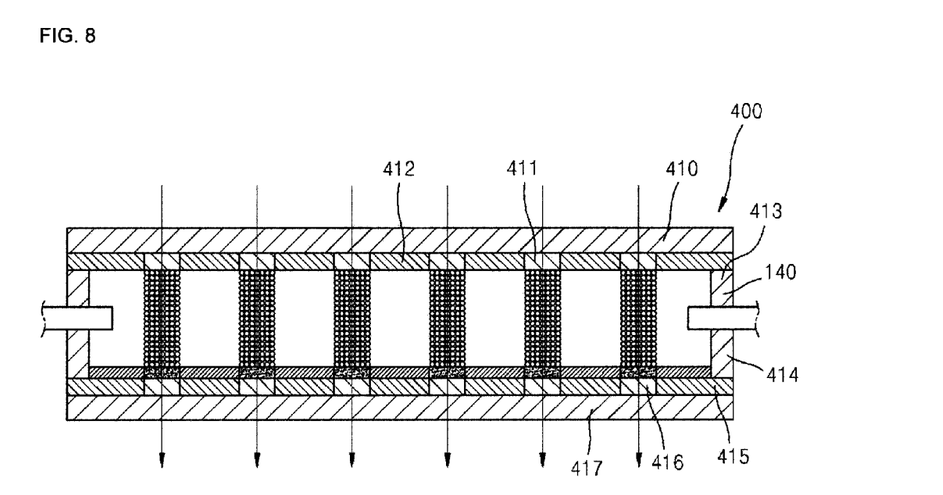

Firstly, an example of a method of manufacturing the test socket 100 is shown in FIGS. 6 to 8. In order to manufacture the test socket 100, a plurality of through holes 121 are formed on the sheet-type support sheet 120 to face the terminals 910 of the device to be tested 900. Such through holes 121 may be formed by using a laser or by mechanical machining.

Subsequently, the sheet-type support sheet 120 is inserted into a mold 400 as shown in FIG. 6. In this case, the mold 400 includes upper and lower molds that make a pair and face each other, and a cavity C is formed in an inner space between the upper and lower molds.

For the upper mold, ferromagnetic layers 411 are formed on the bottom of a substrate 410 to face the terminals 910 of the device to be tested 900 and non-ferromagnetic layers 412 are formed on parts other than the ferromagnetic layers 411. In addition, for the lower mold, ferromagnetic layers 416 are formed on the top of the a substrate 417 to face the terminals 910 of the device to be tested 900 and non-ferromagnetic layers 415 are formed on parts other than the ferromagnetic layers 416. A pair of spacers 413 and 414 are arranged at the edges of the non-ferromagnetic layers and the metal frame 140 is arranged between the spacers 413 and 414.

The support sheet is arranged in such a mold 400. In particular, the support sheet 120 is mounted in the cavity C of the mold 400 so that the through holes 121 of the support sheet 120 may face the ferromagnetic layers 416.

Subsequently, liquid elastic materials 130' in which a plurality of second conductive particles 131 are distributed are charged in the through holes 121 (See FIG. 6).

Subsequently, liquid elastic materials 111' in which a plurality of first conductive particles 111*a* are distributed are charged in the cavity (See FIG. 7).

Subsequently, a magnetic field is applied by an electromagnet (not shown), and thus, while the magnetic field passes between facing ferromagnetic layers 411 and 416, the first conductive particles 111*a* may be arranged in a row (See FIG. 8).

Subsequently, the first liquid elastic material 130' and the second liquid elastic material 111' are heated and cured and thus manufacturion is completed.

In this case, the second conductive particles 131 may be arranged so that they may be arranged in the elastic material at a higher density than the first conductive particles 111a that are arranged in a row. That is, it is desirable to pre-calculate the number of conductive particles to be distributed per unit area and determine the numbers of the first conductive particles 111a and the second conductive particles 131 so that the second conductive particles 131 may be more densely arranged than the first conductive particles 111a.

In this case, the mean droplet diameter of the second conductive particles 131 may be smaller than that of the first conductive particle 111a but the present invention is not limited thereto and the former may be equivalent to the latter.

Figure 9:
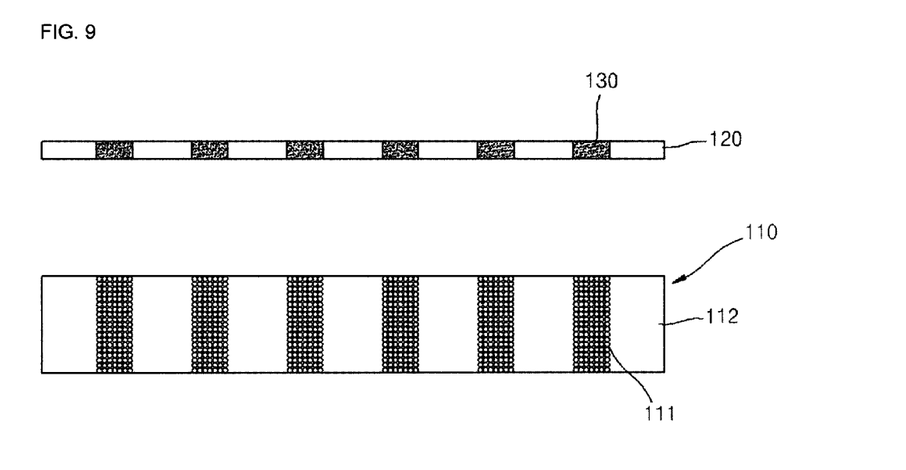
FIGS. 9 and 10 are views of other embodiments of manufacturing the test socket of FIG. 4.
Figure 10:
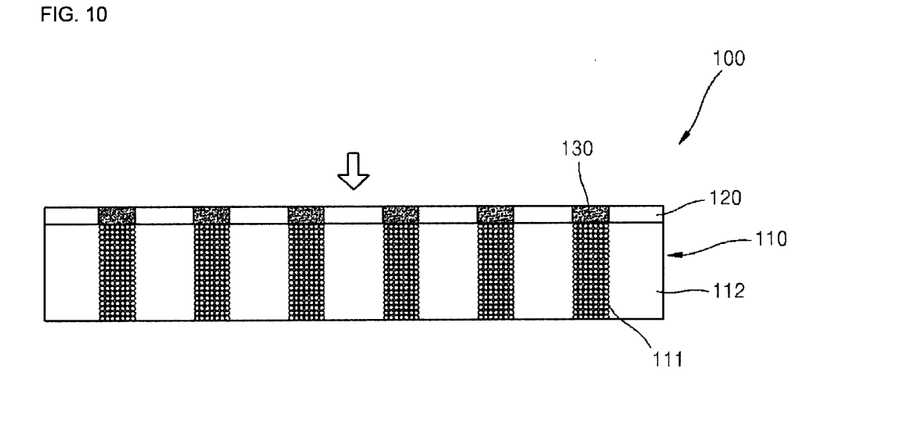

Another example of a method of manufacturing the test socket 100 of the present invention is shown in FIGS. 9 and 10. Firstly, as shown in FIG. 9, a plurality of through holes 121 are formed in the sheet-type support sheet 120 to face the terminals of the device to be tested 900, and subsequently, a liquid elastic material in which a plurality of second conductive particles 131 are distributed is charged in the through holes 121 and the liquid elastic material is cured.

In addition, a liquid elastic material in which a plurality of first conductive particles 111a are distributed is charged in a mold and then a magnetic field is applied to parts corresponding to the terminals 910 of the device to be tested 900 to arrange the first conductive particles 111a in a row. Then, the liquid elastic material is cured to manufacture the elastic conductive sheet 110. The method of manufacturing the elastic conductive sheet 110 is similar to that of FIGS. 6 to 8 and thus a detailed description thereof will not be repeated here. The manufactured support sheet 120 is placed close to the elastic conductive sheet 110 (See FIG. 9).

Subsequently, the support sheet 120 is attached to any one of the top and bottom of the elastic conductive sheet 110. In this case, the support sheet 120 is attached to the elastic conductive sheet 110 by a contact material (See FIG. 10).

Such a test socket according to embodiments of the present invention has the following advantages.

Firstly, the test socket according to an embodiment of the present invention has an advantage in that an electrical connection is excellent since a plurality of conductive particles are charged at high-density in the second conductive unit that is in contact with the device to be tested. In particular, it has an advantage in that it is easy to maintain the original appearance of the second conductive unit despite frequently contacting the device to be tested since the perimeter of the conductive sheet is supported by the support sheet.

In particular, the size of the second conductive particle may be smaller than that of the first conductive particle so that the second conductive particles may be arranged at high-density. In addition, if the mean droplet diameter of the second conductive particle is small, parts that make a point contact with the terminal of the device to be tested may increase. For example, if the size of the second conductive particle is small and the second conductive particles are densely arranged, the amount of the second conductive particles that are in contact with the terminal of the device to be tested increase and thus, parts that are in contact with the terminal of the device to be tested increase. Thus, the present invention has an advantage in that an electrical connection may be enhanced.

Such a test socket according to an embodiment of the present invention may vary as follows.

Figure 11:
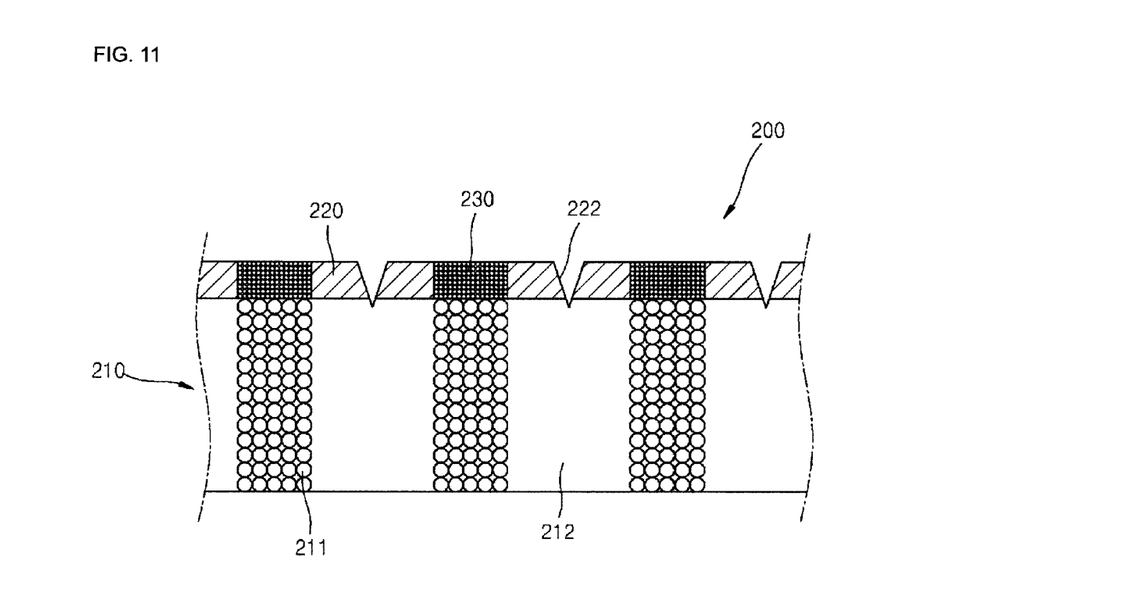
FIG. 11 is a view of a test socket according to another embodiment of the present invention.

Firstly, as shown in FIG. 11, a separating section 222 may be formed in the support sheet 220 so that neighboring second conductive units 230 may independently operate. Such a separating section 222 may be a cutting groove or a cutting hole that is formed by cutting a part of the support sheet 220. If the support sheet 220 is separated by the separating section 222, the neighboring second conductive units 230 may move up and down independently. That is, any one of the second conductive units 230 does not descend to the same or equivalent height of another second conductive unit 230 but may move independently.

Figure 12:
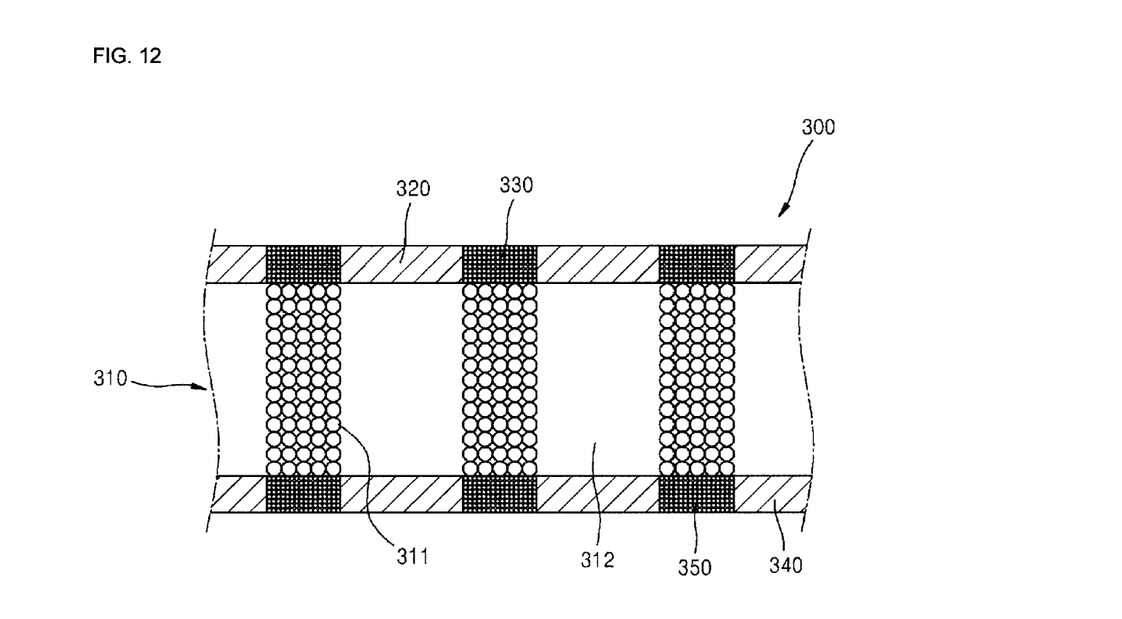
FIG. 12 is a view of a test socket according to another embodiment of the present invention.

In addition, as shown in FIG. 12, the support sheets 230 and 340 may be respectively arranged on the top and bottom of an elastic conductive sheet 310. Also, the second conductive units 330 and 350 may be respectively applied to the top and bottom of the first conductive unit 311 of the elastic conductive sheet 310. In addition, the present invention is not limited thereto and the support sheet may be arranged only on the bottom of the elastic conductive sheet.

While the test socket according to the present invention has been particularly shown and described with reference to exemplary embodiments thereof, it will be understood by those of ordinary skill in the art that various changes in form and details may be made therein without departing from the spirit and scope of the present invention as defined by the following claims.

The invention claimed is:

1. A test socket arranged between a device to be tested and test device and electrically coupling a terminal of the device to be tested to a pad of the test device, the test socket comprising:
   an elastic conductive sheet including a first conductive unit that is arranged to face the terminal of the device to be tested, wherein a plurality of first conductive particles are arranged in an elastic material in a thickness direction, and a dielectric support unit that supports the first conductive unit, and insulates the first conductive unit from a neighboring first conductive unit;
   a support sheet attached to at least one of a top and a bottom of the elastic conductive sheet, wherein the support sheet has a through hole facing the terminal of the device to be tested; and
   a second conductive unit arranged within the through hole of the support sheet without protruding from the upper surface of the support sheet, wherein a plurality of second conductive particles are arranged in an elastic material in a thickness direction;
   wherein the second conductive particle is arranged in the elastic material at a higher density than the first conductive particle; and
   wherein a median droplet diameter of the second conductive particle is smaller than that of the first conductive particle.

2. The test socket of claim 1, wherein the median droplet diameter of the second conductive particle is two times to 10 times smaller than that of the first conductive particle.

3. The test socket of claim 1, wherein the second conductive unit is integrally attached into the through hole.

4. The test socket of claim 1, wherein the second conductive unit is integrally attached into the first conductive unit.

5. The test socket of claim 1, wherein the support sheet has a higher strength than the dielectric support unit.

6. The test socket of claim 1, wherein a separating section is formed in the support sheet to allow neighboring second conductive units to independently operate.

7. The test socket of claim 6, wherein the separating section is a cutting groove or a cutting hole that is formed by cutting the support sheet.

8. A method of manufacturing a test socket that is arranged between a device to be tested and a test device and electrically coupling a terminal of the device to be tested to a pad of the test device, the method comprising:
- forming a plurality of through holes on a sheet-type support sheet to face terminals of the device to be tested;
- providing a mold having a cavity and arranging the sheet-type support sheet in the cavity;
- charging in the through hole a liquid elastic material in which a plurality of second conductive particles is distributed, the liquid elastic material arranged within the through hole so that it does not protrude from a surface of the support sheet;
- charging in the cavity a liquid elastic material in which first conductive particles are distributed; and
- arranging the first conductive particles in a row to face the terminals of the device to be tested by applying a magnetic field, and
- wherein a number of the second conductive particles distributed in the liquid elastic material is determined to allow the second conductive particles to be arranged at a higher density than the first conductive particles that are arranged in a row,
- wherein a median droplet diameter of the second conductive particle is smaller than that of the first conductive particle.

9. A method of manufacturing a test socket that is arranged between a device to be tested and a test device and electrically coupling a terminal of the device to be tested to a pad of the test device, the method comprising:
- forming a plurality of through holes on a sheet-type support sheet to face terminals of the device to be tested;
- charging in the through hole a liquid elastic material in which a plurality of second conductive particles is distributed, and curing the liquid elastic material, the liquid elastic material arranged within the through hole so that it does not protrude from a surface of the support sheet;
- charging in a mold a liquid elastic material in which a plurality of first conductive particles are distributed, arranging the first conductive particles in a row by applying a magnetic field to parts corresponding to the terminals of the device to be tested, and curing the liquid elastic material to manufacture an elastic conductive sheet; and
- attaching the support sheet to at least one of a top and a bottom of the elastic conductive sheet,
- wherein a median droplet diameter of the second conductive particle is smaller than that of the first conductive particle.

10. The method of claim 9, wherein the elastic conductive sheet and the support sheet are adhered to each other by an adhesive material.

\* \* \* \* \*

UNITED STATES PATENT AND TRADEMARK OFFICE
CERTIFICATE OF CORRECTION

PATENT NO.         : 9,488,675 B2
APPLICATION NO.    : 14/355090
DATED              : November 8, 2016
INVENTOR(S)        : Jae Hak Lee Page 1 of 1

It is certified that error appears in the above-identified patent and that said Letters Patent is hereby corrected as shown below:

On the Title Page

Column 1, (30) Foreign Application Priority Data:
"April 3, 2012   (KR).........10-2011-0034578" should be
--April 3, 2012   (KR).........10-2012-0034578--

Signed and Sealed this
Eleventh Day of April, 2017

Michelle K. Lee
*Director of the United States Patent and Trademark Office*